United States Patent
Cao et al.

(10) Patent No.: US 10,319,927 B2
(45) Date of Patent: Jun. 11, 2019

(54) END-BONDED METAL CONTACTS ON CARBON NANOTUBES

(71) Applicant: International Business Machines Corporation, Armonk, NY (US)

(72) Inventors: Qing Cao, Yorktown Heights, NY (US); Shu-Jen Han, Cortlandt Manor, NY (US); Jianshi Tang, Elmsford, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 19 days.

(21) Appl. No.: 14/951,847

(22) Filed: Nov. 25, 2015

(65) Prior Publication Data

US 2017/0133610 A1    May 11, 2017

Related U.S. Application Data

(63) Continuation of application No. 14/933,339, filed on Nov. 5, 2015.

(51) Int. Cl.
*H01L 21/20* (2006.01)
*H01L 51/10* (2006.01)
(Continued)

(52) U.S. Cl.
CPC ........ *H01L 51/105* (2013.01); *H01L 51/0021* (2013.01); *H01L 51/0026* (2013.01);
(Continued)

(58) Field of Classification Search
CPC .................................................... H01L 51/105
(Continued)

(56) References Cited

U.S. PATENT DOCUMENTS

| 6,277,318 B1 * | 8/2001 | Bower | B82Y 30/00 264/235 |
|---|---|---|---|
| 2006/0105523 A1 * | 5/2006 | Afzali-Ardakani | B82Y 10/00 438/257 |

(Continued)

OTHER PUBLICATIONS

Julio A. Rodriguez-Manzo et al, "Heterojunctions between metals and carbon nannotubes as ulimate nanocontacts", 2009; Proceedings of the National Academy of Sciences (PNAS) of the United States of America, vol. 16, No. 12, Mar. 24, 2009; pp. 4591-4595.*

(Continued)

*Primary Examiner* — Ajay Arora
(74) *Attorney, Agent, or Firm* — Cantor Colburn LLP; Vazken Alexanian (57) ABSTRACT

A method of forming an end-bonded contact on a semiconductor is disclosed herein. The method can include forming a dielectric layer on a substrate and depositing a carbon nanotube layer onto the dielectric layer. Additionally, the method can include depositing a resist mask onto the carbon nanotube layer and patterning the resist mask to form a contact mold such that a portion of the carbon nanotube layer is exposed. In some aspects, the method can include depositing a contact metal such that the contact metal contacts the exposed carbon nanotube layer and thermally annealing the device such that the carbon nanotube layer dissolves into the contact metal such that a single contact surface is formed between the contact and the carbon nanotube layer.

17 Claims, 12 Drawing Sheets

(51) Int. Cl.
*H01L 51/00* (2006.01)
*H01L 51/05* (2006.01)

(52) U.S. Cl.
CPC ...... *H01L 51/0048* (2013.01); *H01L 51/0558* (2013.01); *H01L 2251/301* (2013.01)

(58) Field of Classification Search
USPC ........................................................ 438/479
See application file for complete search history.

(56) References Cited

U.S. PATENT DOCUMENTS

2010/0117032 A1* 5/2010 Grigorian ............... B82Y 30/00
  252/507
2013/0146836 A1* 6/2013 Kastalsky ........... H01L 51/0048
  257/13

OTHER PUBLICATIONS

List of IBM Patents or Patent Applications Treated as Related; (Appendix P), Filed Feb. 1, 2016; 2 pages.
Qing Cao, et al., "End-Bonded Metal Contacts on Carbon Nanotubes", U.S. Appl. No. 14/933,339, filed Nov. 5, 2015.

* cited by examiner

END-BONDED METAL CONTACTS ON CARBON NANOTUBES

PRIORITY

This application is a Continuation of U.S. patent application Ser. No. 14/933,339, filed Nov. 5, 2015, and all the benefits accruing therefrom under 35 U.S.C. § 119, the contents of which in its entirety are herein incorporated by reference.

BACKGROUND

The present invention relates to metal-oxide-semiconductor field-effect transistors (MOSFET), and more specifically, to end-bonded metal contacts on carbon nanotubes.

The MOSFET is a transistor used for amplifying or switching electronic signals. The MOSFET has a source, a drain, and a metal oxide gate electrode. The metal gate is electrically insulated from the main semiconductor n-channel or p-channel by a thin layer of insulating material, for example, silicon dioxide or glass, which makes the input resistance of the MOSFET relatively high. The gate voltage controls whether the path from drain to source is an open circuit ("off") or a resistive path ("on").

N-type field effect transistors (NFET) and p-type field effect transistors (PFET) are two types of complementary MOSFETs. The NFET uses electrons as the current carriers and is built with n-doped source and drain junctions. The PFET uses holes as the current carriers and is built with p-doped source and drain junctions.

The evolution of modern complementary metal-oxide semiconductor (CMOS) technology continuously scales down not only the device channel length but also the contact length. As the channel length reaches tens of nanometers, the contact resistance becomes comparable with the channel resistance, and hence gradually limits the transistor drive current.

SUMMARY

A method of forming an end-bonded contact on a semiconductor is provided herein. The method can include forming a dielectric layer on a substrate and depositing a carbon nanotube layer onto the dielectric layer. Additionally, the method can include depositing a resist mask onto the carbon nanotube layer and patterning the resist mask to form a contact mold such that a portion of the carbon nanotube layer is exposed. In some aspects, the method can include depositing a contact metal such that the contact metal contacts the exposed carbon nanotube layer and thermally annealing the device such that the carbon nanotube layer dissolves into the contact metal such that a single contact surface is formed between the contact and the carbon nanotube layer.

In other aspects, a method of forming an end-bonded contact on a semiconductor device can include forming a dielectric layer on a substrate and depositing a carbon nanotube layer onto the dielectric layer, and depositing a resist mask onto the carbon nanotube layer and patterning the resist mask to form a contact mold such that a portion of the carbon nanotube layer is exposed. In some aspects, the method can further include depositing a contact metal such that the contact metal contacts the exposed carbon nanotube layer, the contact metal being a metal that does not form stable carbides at a temperature of less than about 1000° C. Further, the method can include thermally annealing the device such that the carbon nanotube layer dissolves into the contact metal such that a single contact surface is formed between the contact and the carbon nanotube layer.

A semiconductor device is disclosed herein. In some aspects, the semiconductor device can include a substrate having a dielectric layer formed thereon and a carbon nanotube layer formed on the dielectric layer. In some aspects, the semiconductor device can include an end-bonded contact formed of a metal having the carbon nanotube layer dissolved in the metal such that the contact has a single surface contact between the contact and the carbon nanotube layer.

BRIEF DESCRIPTION OF THE DRAWINGS

The subject matter which is regarded as the invention is particularly pointed out and distinctly claimed in the claims at the conclusion of the specification. The forgoing and other features, and advantages of the invention are apparent from the following detailed description taken in conjunction with the accompanying drawings in which:

DETAILED DESCRIPTION

As stated above, the present invention relates to MOS-FETs, and particularly to end-bonded metal contacts, which are now described in detail with accompanying figures. It is noted that like reference numerals refer to like elements across different embodiments.

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

As used herein, the articles "a" and "an" preceding an element or component are intended to be nonrestrictive regarding the number of instances (i.e. occurrences) of the element or component. Therefore, "a" or "an" should be read to include one or at least one, and the singular word form of the element or component also includes the plural unless the number is obviously meant to be singular.

As used herein, the terms "invention" or "present invention" are non-limiting terms and not intended to refer to any single aspect of the particular invention but encompass all possible aspects as described in the specification and the claims.

As used herein, the term "about" modifying the quantity of an ingredient, component, or reactant of the invention employed refers to variation in the numerical quantity that can occur, for example, through typical measuring and liquid handling procedures used for making concentrates or solutions. Furthermore, variation can occur from inadvertent error in measuring procedures, differences in the manufacture, source, or purity of the ingredients employed to make the compositions or carry out the methods, and the like. In one aspect, the term "about" means within 10% of the reported numerical value. In another aspect, the term "about" means within 5% of the reported numerical value. Yet, in another aspect, the term "about" means within 10, 9, 8, 7, 6, 5, 4, 3, 2, or 1% of the reported numerical value.

As described above, the evolution of modern complementary metal-oxide semiconductor (CMOS) technology continuously scales down not only the device channel length but also the contact length. As the channel length reaches tens of nanometers, the contact resistance can become comparable with the channel resistance, and gradually limit the transistor drive current. Among all the candidate materials for post-silicon era, carbon nanotubes (CNTs) have intrinsic ultrathin body and exceptional electrical properties (high on current, superior current on/off ratio, long mean-free-path for ballistic transport), which make them one of the most promising candidates for sub-10 nm technology node in semiconductor industry. Because of its ultrathin body nature, conventional contacts to CNT devices are usually side contacts made by directly depositing metal on top of CNTs. Such side contacts have unfavorable contact length scaling characteristics: in the case of typical Pd contact, the contact resistance increases dramatically as the contact length goes below 100 nm. In the implementation of future CNT-based CMOS technology, end-bonded metal contacts are highly desired, in which the contact resistance is theoretically independent of the contact length. So far, a CMOS-compatible process of fabricating such end-bonded metal contacts is in lack.

Figure 1:
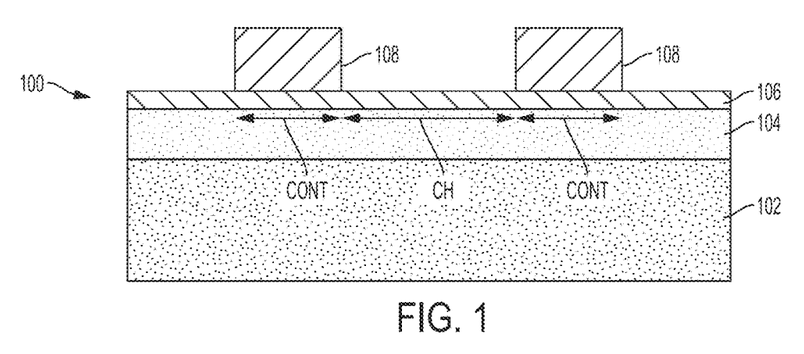
FIG. 1 illustrates a conventional contact to CNT device.
Figure 2:
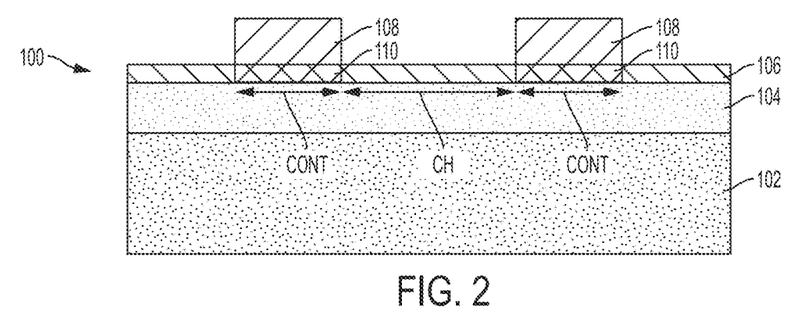
FIG. 2 illustrates a conventional contact to CNT device.

FIGS. 1-2 illustrate conventional contact to CNT device 100. As shown, the conventional device 100 is formed of a silicon substrate 102 with a dielectric layer 104 formed on the substrate 102. The device 100 also has a CNT layer 106 disposed above the dielectric layer 104. Finally, conventional device 100 has metal side contacts 108 formed above the CNT layer 106. A solid-state reaction procedure can be used to form a carbide layer 110 of the contact 108. These conventional metal side contacts to CNT devices, however, can have unfavorable contact length $L_{cont}$ scaling characteristics.

As mentioned, previously proposed end-bonded carbide contacts 110 rely on a solid-state reaction between metal contact 108 and CNT 106 to form the contact surface between the metal carbide 110 and the CNT layer 106. This process produces a metal carbide 110, which produces two contact interfaces, one between the carbide 110 and the CNT layer 106 and one between the metal contact 108 and the carbide 110. Additionally, these conventional structures typically requires very high temperature annealing, which may not be compatible with standard CMOS process.

Figure 3:
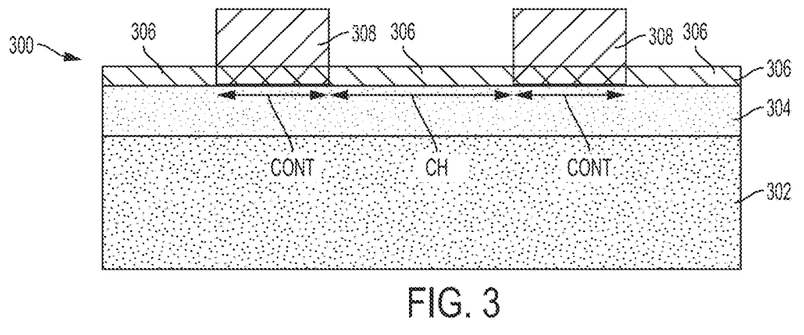
FIG. 3 illustrates an exemplary CMOS device having an end-bonded metal contact.

As such, desired CMOS devices can have a single contact surface—metal to CNT—as shown in FIG. 3. FIG. 3 illustrates an exemplary CMOS device 300 having an end bonded metal contact 308. The CMOS device 300 is formed of a substrate 302 with a dielectric layer 304 disposed above the substrate 302. The CMOS device 300 also includes a carbon nanotube (CNT) layer 306 disposed above the dielectric layer 304. Finally, as shown, the CMOS device 300 includes a contact 308 that is in direct contact with the CNT layer 306 and without carbide formation. To achieve this, as will be described in detail herein, thermal annealing processes can be utilized to drive the dissolution of carbon nanotubes into the contact metal while simultaneously avoiding carbide formation in the contact metal.

Figure 4:
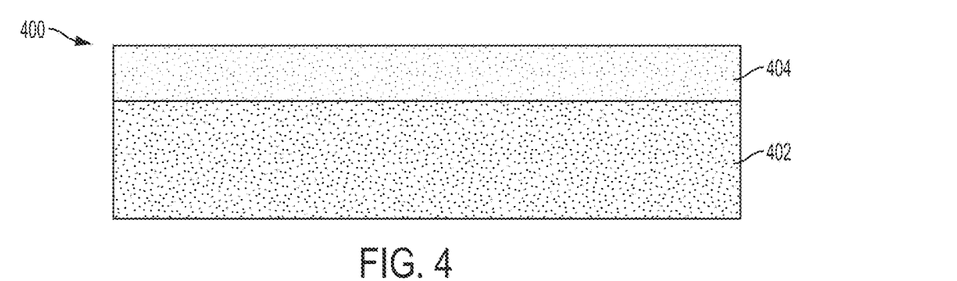
FIG. 4 illustrates a starting point for producing an end-bonded metal contact to CNT device.

FIG. 4 illustrates a starting point for producing an end-bonded metal contact to CNT device 400. As shown, the starting point for the device 400 is formed of a substrate 402 with a dielectric layer 404 formed on the substrate 402. Any suitable substrate can be used, for example, silicon, silicon germanium, or any other substrate and can include any desired dopants such as p-type dopants (e.g., boron), n-type dopants (e.g., phosphorus), or any combination thereof. Non-limiting examples of suitable substrate 402 materials include Si (silicon), strained Si, SiC (silicon carbide), Ge (germanium), SiGe (silicon germanium), SiGeC (silicongermanium-carbon), Si alloys, Ge alloys, GaAs (gallium arsenide), InAs (indium arsenide), InP (indium phosphide), or any combination thereof.

Moreover, the dielectric layer 404 can be deposited on the substrate 402 using any known process and the dielectric layer 404 can be formed of any known dielectric material. In some aspects, the dielectric layer 404 is a high-k gate dielectric. In some aspects, the dielectric layer can include a low-k dielectric oxide, including but not limited to, spin-on-glass, a flowable oxide, a high density plasma oxide, or any combination thereof. Additionally, the CNT device 400 can include various other layers (not shown) including but not limited to silicon dioxide, tetraethylorthosilicate (TEOS) oxide, high aspect ratio plasma (HARP) oxide, silicon oxide, high temperature oxide (HTO), high density plasma (HDP) oxide, oxides formed by an atomic layer deposition (ALD) process, or any combination thereof, insulating liners—for example, silicon nitride (SiN), SiOCN, or SiBCN. Furthermore, the CNT device 400 can include various epitaxial layers (not shown). Epitaxial layers may be grown using a suitable growth process, for example, chemical vapor deposition (CVD) (liquid phase (LP) or reduced pressure chemical vapor deposition (RPCVD), vapor-phase epitaxy (VPE), molecular-beam epitaxy (MBE), liquid-phase epitaxy (LPE), metal organic chemical vapor deposition (MOCVD), or other suitable processes.

Additionally, the substrate 402 and dielectric layer 404 can have any suitable thickness. For example, the substrate 402 can be about 100 micron (um) to about 500 micron (um) thick. The dielectric can be dimensioned in any suitable manner. For example, the dielectric layer 404 can be about 2 nanometers (nm) to about 300 nanometers (nm) thick.

Figure 5:
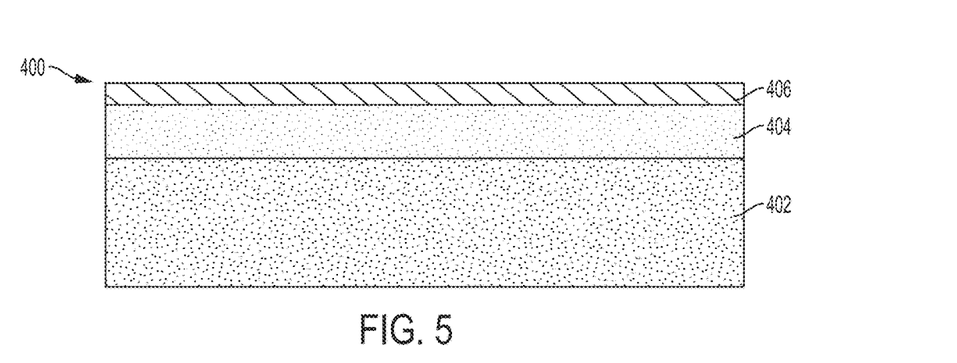
FIG. 5 illustrates the starting point of FIG. 4 having a carbon nanotube (CNT) layer disposed above the dielectric layer.

FIG. 5 illustrates the device 400 having a carbon nanotube (CNT) layer 406 disposed above the dielectric layer 404. The CNT layer 406 can be formed of any suitable carbon nanotube material. For example, the CNT layer can be formed by drop casting CNT solution on top of the dielectric layer 404. Alternatively, the CNT layer can be formed by aligning or growing CNTs on the dielectric layer 404. For example, highly-purified carbon nanotube materials can be used to form the CNT layer 406. Suitable carbon nanotube materials can include highly purified carbon nanotube materials with various densities.

Figure 6:
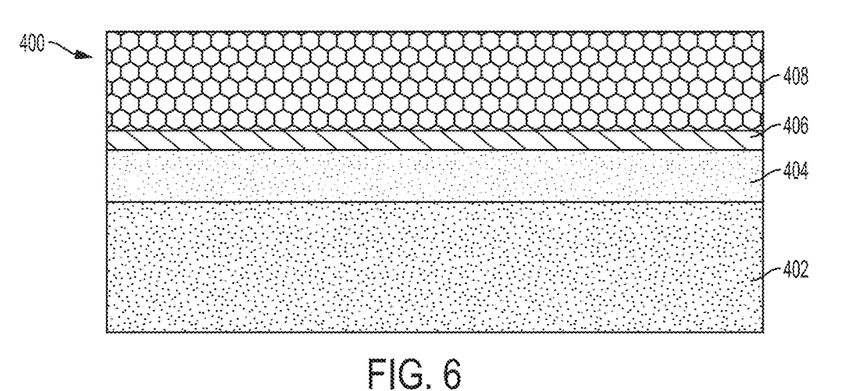
FIG. 6 illustrates the device of FIG. 5 having a resist mask applied to the CNT layer.

FIG. 6 illustrates the device 400 having a resist mask 408 applied to the CNT layer 406. In some aspects, the resist mask 408 can be used to protect portions of the device 400, and specifically the CNT layer 406, and/or to form molds for depositing subsequent layers onto the device 400. The resist mask 408 may be any suitable resist. Suitable resists include photoresists, electron-beam resists, ion-beam resists, X-ray resists, and etchant resists. The resist may a polymeric spin on material or a polymeric material. The resist mask 408 may be removed by, for example, an ashing process.

In some aspects and as will be discussed below, the resist mask 408 can be selectively removed, such as by using electron beam lithography processing steps. In some aspects and as will be discussed later, the resist mask 408 can be a resist that is selectively removable—such as with isopropyl alcohol (IPA)—following desired processing steps. In some aspects the resist mask 408 can be a polymethyl methacrylate (PMMA) resist, but any suitable resist mask can be used. Further, the resist mask 408 can have any suitable dimensions. For example, the resist mask 408 can be about 50 nanometers (nm) to about 1000 nanometers (nm) thick. In some aspects, the resist mask 408 can be spin-coated and baked onto the device 400, but any suitable deposition techniques can be used. The resist mask layer can be deposited by any suitable method depending on the type of material and can be, for example, plasma-enhanced chemical vapor deposition (PECVD), atomic layer deposition (ALD), or as described above spin-coating.

Figure 7:
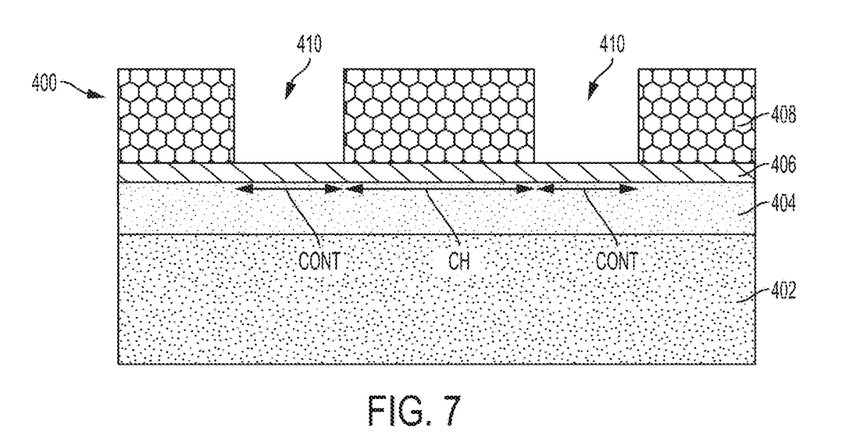
FIG. 7 illustrates the device of FIG. 6 having metal contact molds patterned in the resist mask.

FIG. 7 illustrates the device 400 having metal contact molds 410 patterned in the resist mask 408. Any suitable method of forming metal contact molds 410 can be used. For example, in some aspects, the resist mask 408 can be etched or removed using electron beam (e-beam) lithography to expose a portion of the resist mask 408 in desired areas forming the metal contact molds 410. In other aspects, any suitable etching process can be used to expose and pattern the contact molds 410, including isotropic or anisotropic etches such as reverse ion etching.

The metal contact molds can have any suitable dimensions. For example, in some aspects the metal contact molds 410 can have a contact length $L_{cont}$ of about 5 nanometers (nm) to about 1000 nanometers (nm). In some aspects, the metal contact molds 410 can have a contact length $L_{cont}$ of about 10 nanometers (nm) to about 100 nanometers (nm). Additionally, as shown, more than one metal contact mold 410 can be formed. As such, the distance between each contact mold, or channel length $L_{ch}$, can be any suitable distance. In some aspects, the channel length $L_{ch}$ can be about 5 nanometers (nm) to about 1000 nanometers (nm). In some aspects, the channel length $L_{ch}$ can be about 10 nanometers (nm) to about 150 nanometers (nm).

Figure 8:
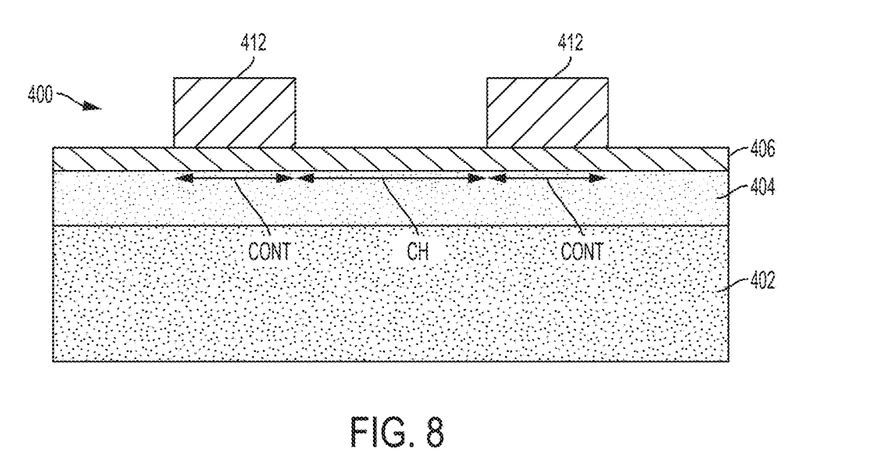
FIG. 8 illustrates the device of FIG. 7 having contact metal deposited on the device.

Next, the contact metal can be deposited on the device 400. FIG. 8 illustrates the device 400 having contact metal 412 deposited on the device 400. Also shown in FIG. 8, following deposition of the contact metal 412, the resist mask 408 can be removed, or lifted off, from the device 400. Any suitable method of removing the resist mask 408 can be used. In some aspects, acetone can be used to remove the remaining resist mask to expose the CNT layer 406. Additionally, in some aspects, the contact metal 412 can be planarized, either prior to or after removal of the remaining resist mask. Specifically, in some aspects, the contact metal 412 is planarized using chemical-mechanical planarization (CMP) techniques.

Figure 9:
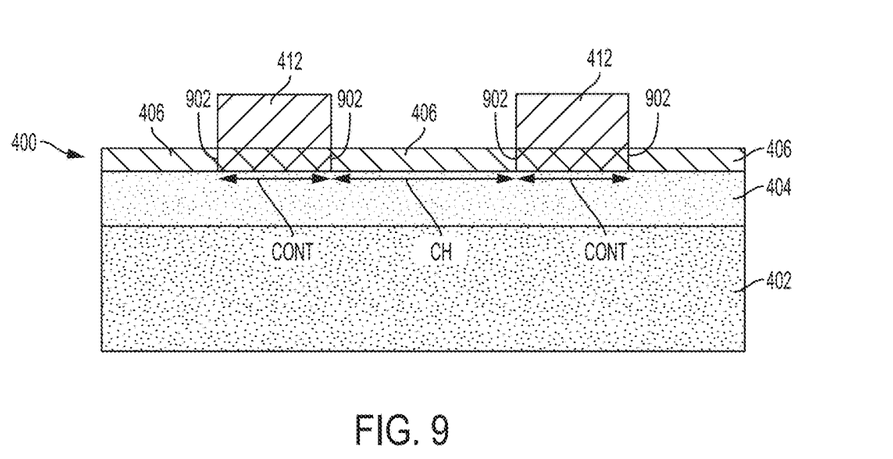
FIG. 9 illustrates the device of FIG. 8 having a contact deposited on the device following a thermal annealing process.

FIG. 9 illustrates the device 400 having a contact 412 deposited on the device 400 following a thermal annealing process. Once the contact 412 is deposited and the resist mask 408 is removed, the device 400 can be thermally annealed at a pre-determined temperature. As shown in FIG. 9, the thermal annealing process can drive the CNT material to migrate or diffuse into the contact 412 metal creating an end-bonded contact 412 with only one contact interface surface 902 between the contact 412 and the CNT layer 406, i.e., there is no carbide contact surface as is shown in conventional devices.

The contact 412 can be formed of any suitable metal. In some aspects, the contact metal has a sufficiently high solubility of carbon such that the CNT can dissolve into the metal contact during a thermal annealing process. In particular, the contact metal can be a metal that has a sufficiently high solubility of carbon such that the CNT can dissolve into the metal contact during a low-temperature thermal annealing.

Additionally, the metal can be selected such that the metal does not form a carbide at relatively low thermal annealing temperatures. Specifically, thermal annealing steps are traditionally performed at high temperatures (such as greater than about 1000° C.) and relatively low thermal annealing temperatures are sought in order to lower the risk of damaging devices with high temperatures. As such, in some aspects, the contact metal can be selected such that no carbides are formed during a thermal annealing process at a desired temperature of less than about 1000° C. By way of non-limiting example, a metal can be selected that does not form a carbide at a thermal annealing temperature of about 400° C. to about 600° C. As such, the contact metal will form end-bonded metal contacts near the original contact edge and will not form a carbide contact surface as conventional devices do.

As mentioned any metal that has high CNT solubility and resists carbide formation at low temperatures can be used to form the contacts 412. In some aspects, the contact metal 412 can be any of nickel (Ni), cobalt (Co), iron (Fe), copper (Cu), gold (Au), silver (Ag), ruthenium (Ru), palladium (Pd), platinum (Pt), iridium (Ir), and any mixtures or alloys thereof. For example, the contact metal 412 can be nickel. For example, the contact metal 412 can be cobalt.

Figure 10:
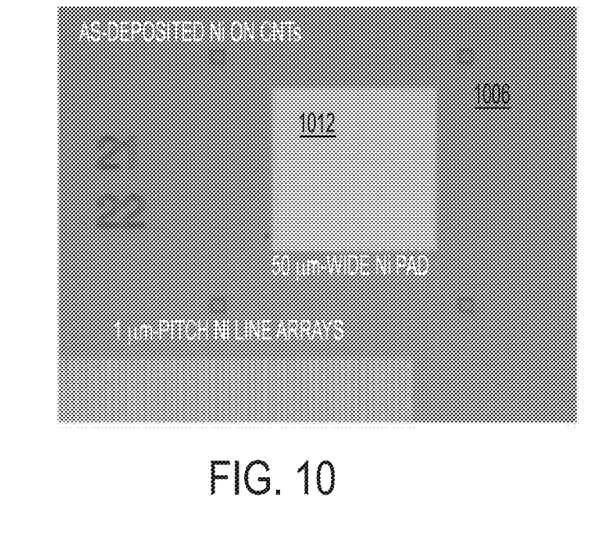
FIG. 10 is an optical microscope image of a nickel contact formed on a carbon nanotube layer.
Figure 11:
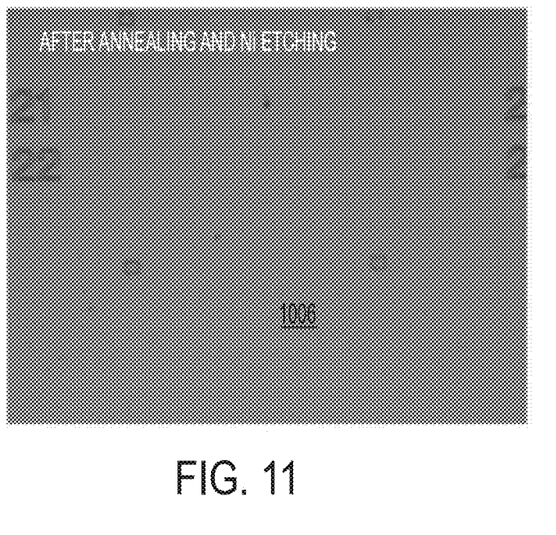
FIG. 11 is an optical microscope image of the carbon nanotube layer of FIG. 10 after an annealing process and after etching the nickel layer.
Figure 12:
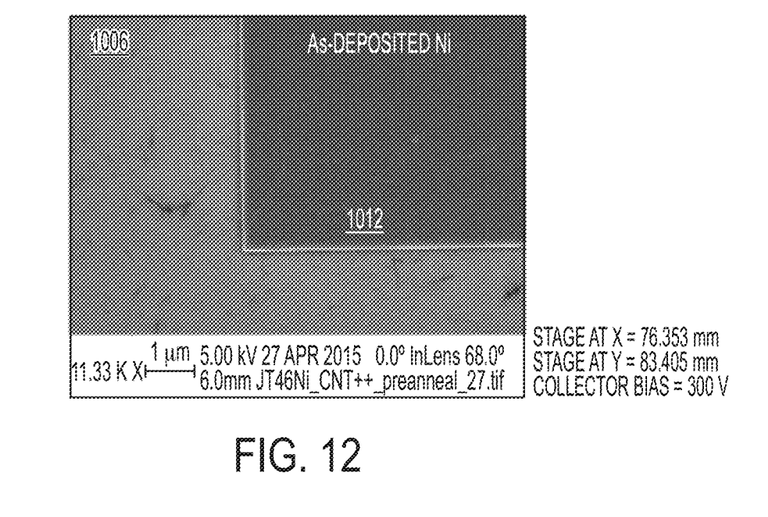
FIG. 12 is a scanning electron microscope image of the carbon nanotube layer of FIG. 10 with the nickel layer deposited on the carbon nanotube layer prior to annealing and etching the nickel layer.

FIGS. 10-16 illustrate optical microscope and scanning electron microscope images of various CMOS devices having end-bonded contacts as described herein. FIG. 10 illustrates a nickel contact 1012 formed on a carbon nanotube layer 1006. FIG. 11 illustrates the carbon nanotube layer 1006 of FIG. 10 after an annealing process and after etching the nickel layer 1012. FIG. 12 illustrates the nickel layer 1012 deposited on the carbon nanotube layer 1006 prior to annealing and etching the nickel layer 1012.

Figure 13:
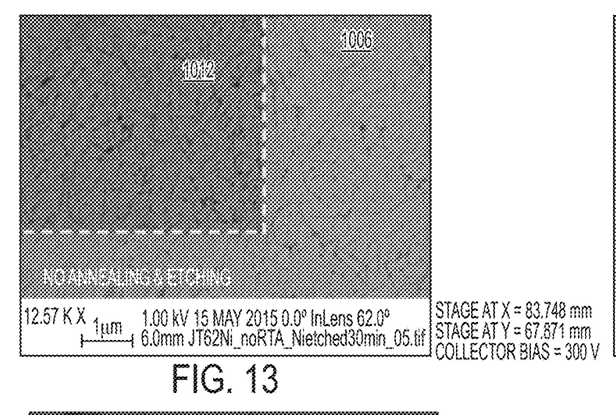
FIG. 13 is a scanning electron microscope image of the carbon nanotube layer of FIG. 10 with the nickel layer deposited on a carbon nanotube layer with no annealing following an etching process of the nickel layer.
Figure 14:
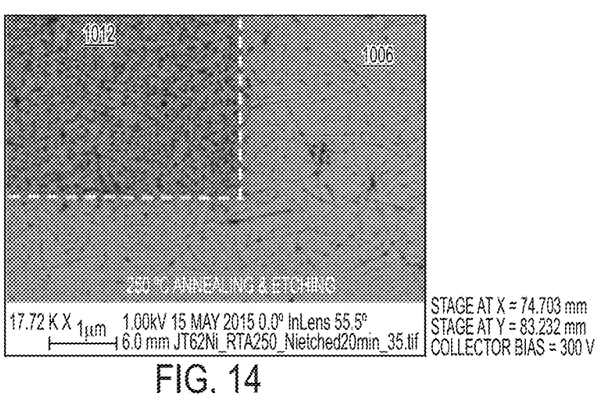
FIG. 14 is a scanning electron microscope image of the carbon nanotube layer of FIG. 10 with the nickel layer deposited on a carbon nanotube layer annealed at temperatures of 250° C. following an etching process of the nickel layer.
Figure 15:
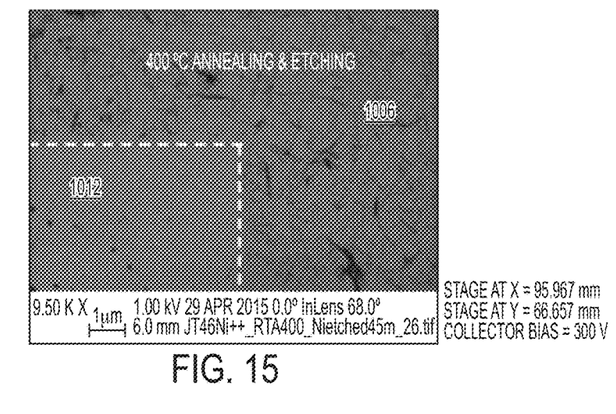
FIG. 15 is a scanning electron microscope image of the carbon nanotube layer of FIG. 10 with the nickel layer deposited on a carbon nanotube layer annealed at temperatures of 400° C. following an etching process of the nickel layer.
Figure 16:
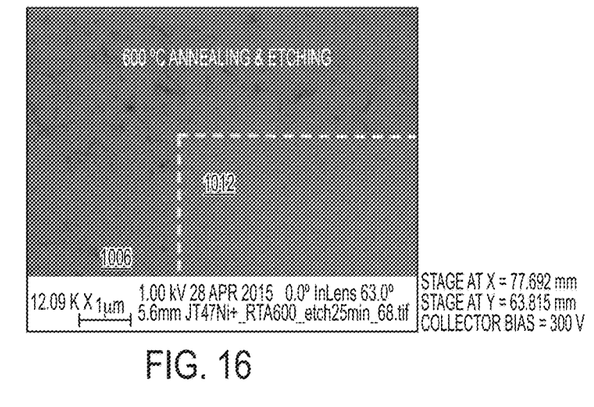
FIG. 16 is a scanning electron microscope image of the carbon nanotube layer of FIG. 10 with the nickel layer deposited on a carbon nanotube layer annealed at temperatures of 600° C. following an etching process of the nickel layer.

This is further illustrated in FIGS. 13-16, which illustrate the nickel layer 1012 deposited on a carbon nanotube layer 1006 as shown in FIGS. 10-12 and then annealed at temperatures of 250° C., 400° C., and 600° C. and finally etching the nickel layer away to reveal the carbon nanotube layer 1006 that remains after the annealing process. FIG. 13 illustrates the nickel layer 1012 deposited on a carbon nanotube layer 1006 as shown in FIGS. 10-12 with no annealing following an etching process. FIG. 14 illustrates the nickel layer 1012 deposited on a carbon nanotube layer 1006 as shown in FIGS. 10-12 annealed at temperatures of 250° C. following an etching process. FIG. 15 illustrates the nickel layer 1012 deposited on a carbon nanotube layer 1006 as shown in FIGS. 10-12 annealed at temperatures of 400° C. following an etching process. FIG. 16 illustrates the nickel layer 1012 deposited on a carbon nanotube layer 1006 as shown in FIGS. 10-12 annealed at temperatures of 600° C. following an etching process. As can readily be seen in FIG. 13, with no annealing there is no difference between the carbon nanotube material left beneath the nickel layer 1012 and the carbon nanotube layer 1006 that was not in contact with the nickel layer 1012. As shown in FIG. 14, when the device is annealed at 250° C., there is again little difference between the amount of carbon nanotubes remaining beneath the nickel layer 1012 and the carbon nanotube layer 1006 that was not in contact with the nickel layer 1012. As shown in FIGS. 15 and 16, however, when the device is annealed at temperatures of 400° C. and 600° C., the carbon nanotubes that were beneath the nickel layer 1012 have entirely been dissolved into the nickel layer 1012 and etched away.

Figure 17:
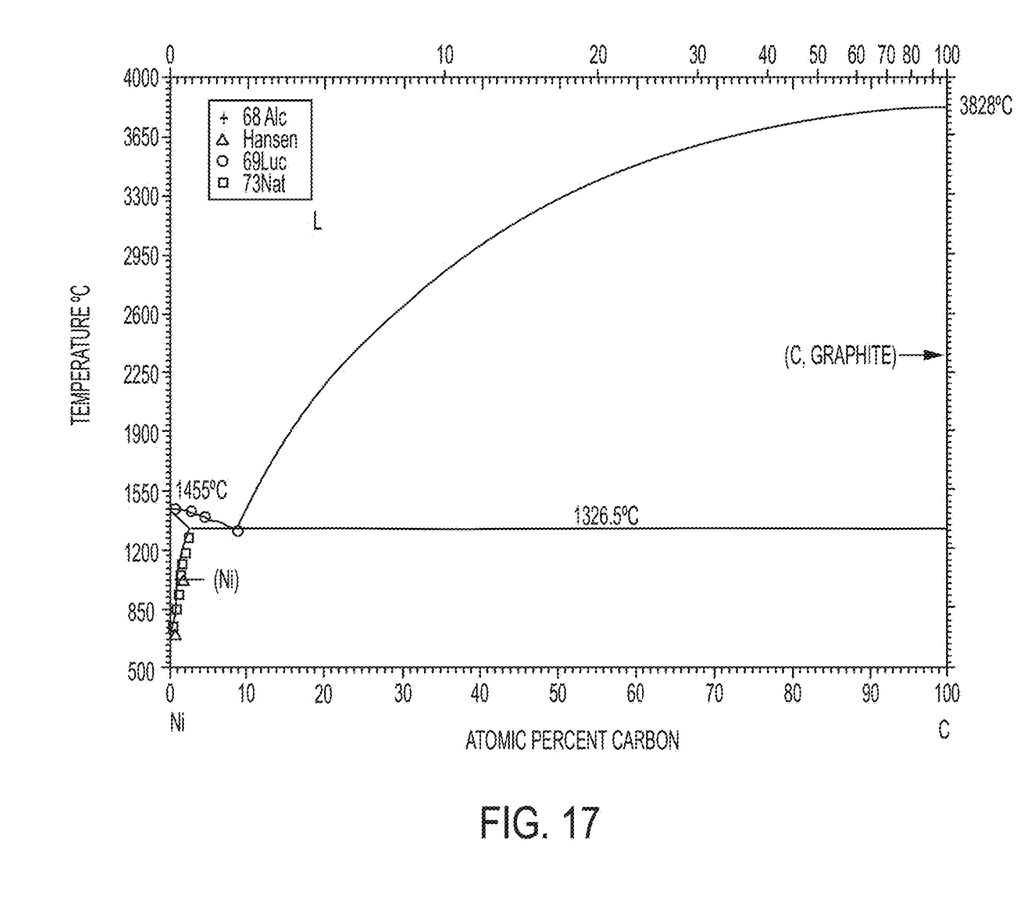
FIG. 17 illustrates a phase diagram for a nickel (Ni)-carbon (C) system.
Figure 18:
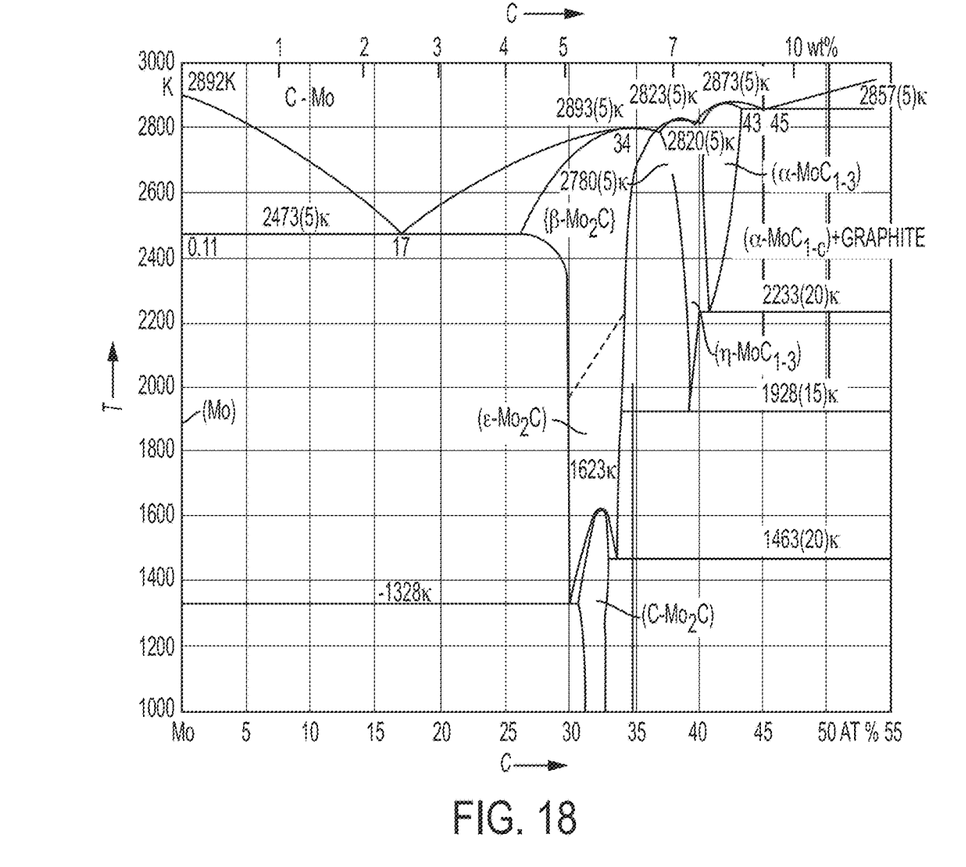
FIG. 18 illustrates a phase diagram for a molybdenum (Mo)-carbon (C) system.

Furthermore, this surprising result is theoretically verified by observing phase diagrams for example metal-carbon systems. For example, FIGS. 17 and 18 illustrate phase diagrams for example metals. Specifically, FIG. 17 illustrates a phase diagram for a nickel (Ni)-carbon (C) system and FIG. 18 illustrates a phase diagram for a molybdenum (Mo)-carbon (C) system. As can be seen in FIG. 18, there are multiple stable carbides formed between molybdenum and carbon. In contrast to the molybdenum system shown in FIG. 18, FIG. 17 illustrates that there are no stable nickel-carbides formed, and in particular there are no nickel-carbides formed at the relatively low thermal annealing temperatures of the present disclosure. That is, nickel-carbides are not formed at thermal annealing temperatures of below about 1000° C. or between about 400° C. and about 600° C.

Figure 19:
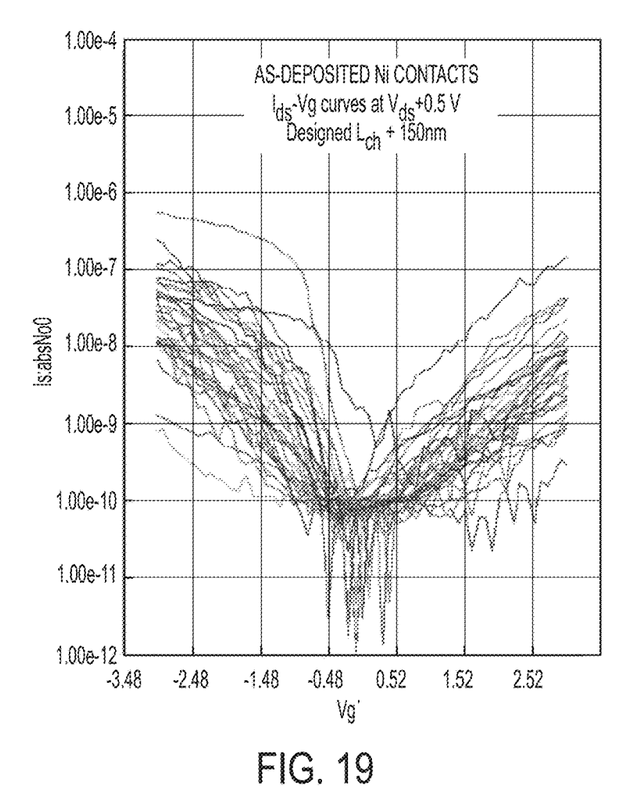
FIG. 19 illustrates an example CNT transistor having a conventional nickel side contact with no annealing (as-deposited)
Figure 20:
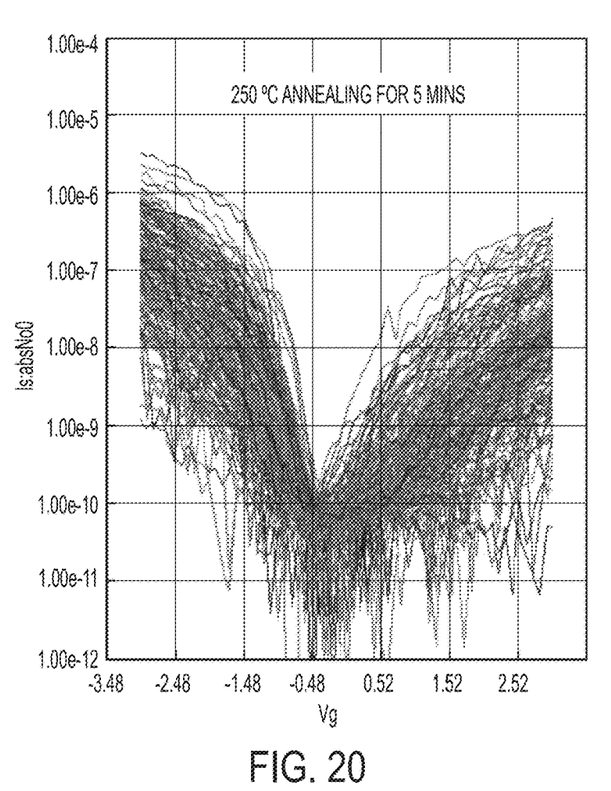
FIG. 20 illustrates an example CNT transistor having a nickel contact annealed at 250° C.
Figure 21:
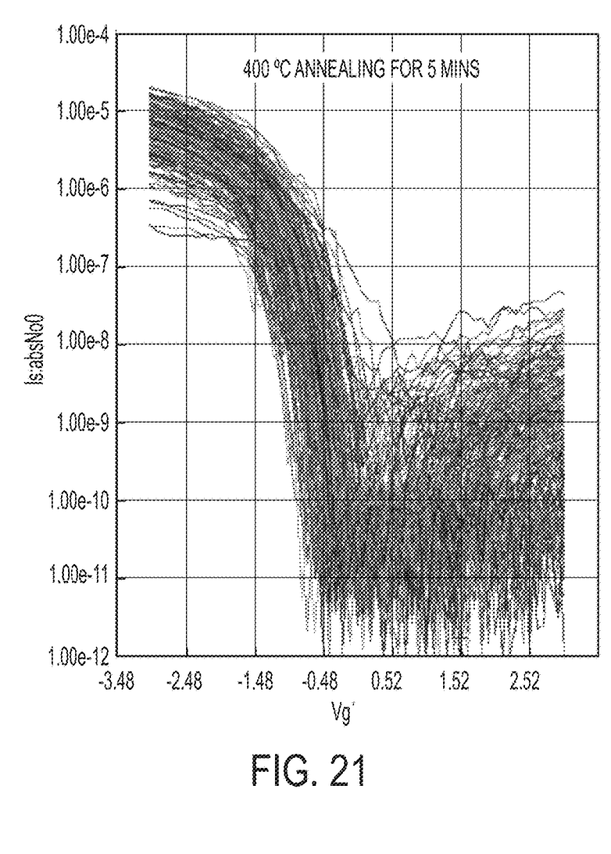
FIG. 21 illustrates an example CNT transistor having a nickel contact annealed at 400° C., forming end-bonded nickel contact.
Figure 22:
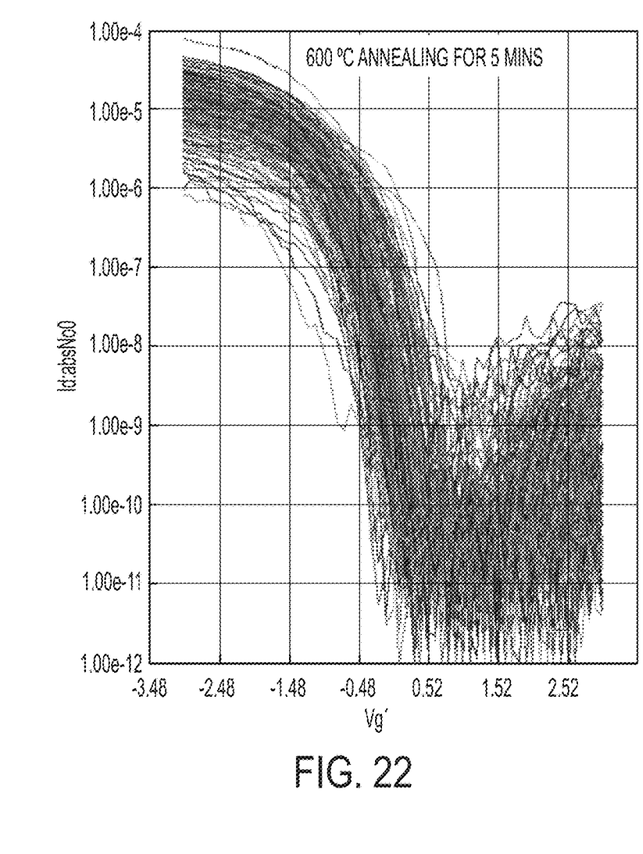
FIG. 22 illustrates an example CNT transistor having a nickel contact annealed at 600° C., forming end-bonded nickel contact.

This is further illustrated when utilizing example end-bonded nickel contact for CNT transistors. Specifically, FIGS. 19-22 illustrate voltage analysis (transfer characteristics) of nickel contacts with either no annealing or annealed at 250° C., 400° C., and 600° C. FIG. 19 illustrates an example CNT transistor having a conventional nickel side contact with no annealing. FIG. 20 illustrates an example CNT transistor having a nickel contact annealed at 250° C. FIG. 21 illustrates an example CNT transistor having a nickel contact annealed at 400° C., forming end-bonded nickel contact. FIG. 22 illustrates an example CNT transistor having a nickel contact annealed at 600° C., forming end-bonded nickel contact. As can be seen in FIG. 19, example CNT transistors having a nickel side contact with no annealing exhibit ambipolar characteristics. These ambipolar characteristics are enhanced with annealing at 250° C. These ambipolar characteristics are undesirable. As can readily be seen in FIGS. 21 and 22, annealing the example CNT transistor having an end-bonded nickel contact at temperatures of either 400° C. or 600° C. eliminates this undesirable ambipolar characteristic, and shows much improved unipolar p-type characteristics.

Figure 23:
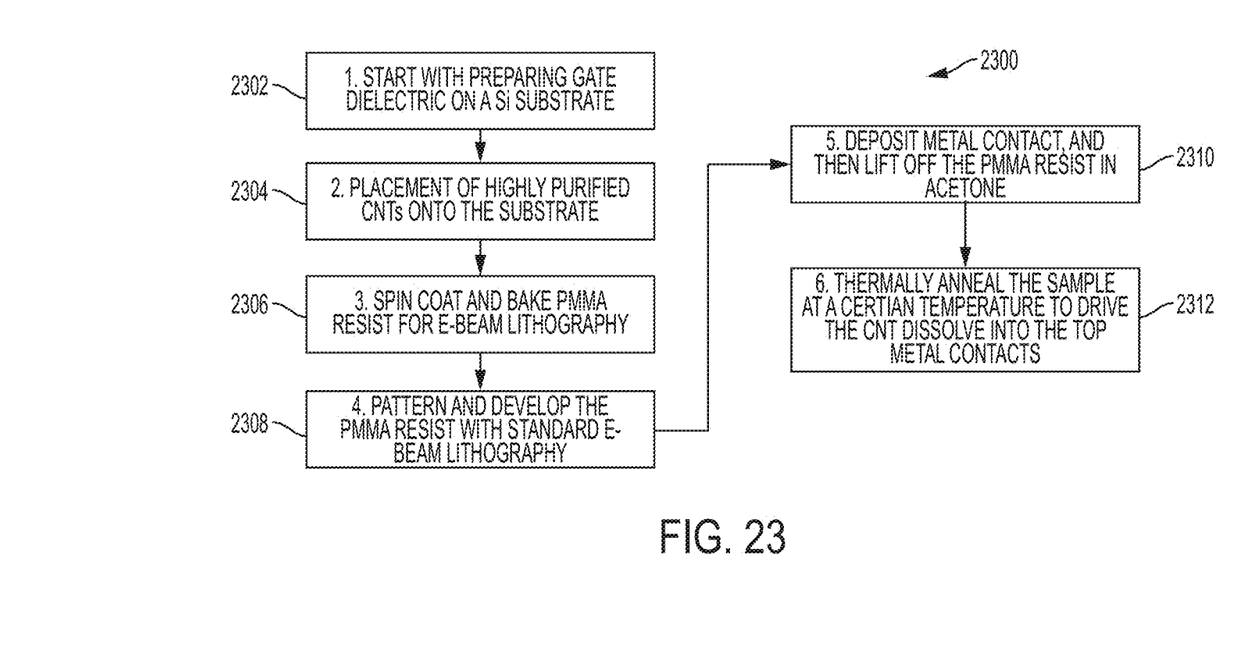
FIG. 23 is a block diagram of an example method of forming an end-bonded metal contact on CNT device.

As described above, various suitable methods of forming an end-bonded contact on a CMOS or semiconductor device exist. One such exemplary method 2300 is illustrated in FIG. 23. The method 2300 can include starting with a gate dielectric layer formed on a silicon substrate as shown in block 2302. The method 2300 can include placement or deposition of highly purified carbon nanotubes onto the substrate or dielectric layer as shown in block 2304. Additionally, the method 2300 can include depositing—such as by spin-coating and baking—a PMMA resist layer configured for electron beam lithography on the carbon nanotube layer as shown in block 2306. Next, as shown in block 2308, the PMMA resist layer can be etched or patterned using standard electron beam lithography techniques to pattern mold for forming contacts on the device. As illustrated in block 2310, the method 2300 can further include depositing a metal contact on the device and removing the remaining PMMA resist. In some aspects block 2310 can further include a planarization step and can include using acetone to remove the PMMA resist. Finally, as shown in block 2312, the device can be thermally annealed at a relatively low temperature to drive the CNT to dissolve into the metal contact.

As used herein, "deposition" means any suitable deposition process including but not limited to chemical vapor deposition (CVD), plasma vapor deposition (PVD), plasma enhanced CVD, atomic layer deposition (ALD), evaporation, chemical solution deposition, or like processes. As used herein, "etching" can include any suitable etching process including but not limited to wet etching processes using aqueous hydrofluoric acid (HF) and nitric acids, lithographic patterning and etching processes, reactive ion etching (RIE).

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method of forming an end-bonded contact on a semiconductor, comprising:
   forming a dielectric layer on a substrate;
   depositing a carbon nanotube layer onto the dielectric layer;
   depositing a resist mask onto the carbon nanotube layer;
   patterning the resist mask to form a contact mold such that a portion of the carbon nanotube layer is exposed;
   depositing a contact metal onto the carbon nanotube layer such that a portion of the contact metal directly contacts the exposed carbon nanotube layer; and
   annealing the device such that a portion of the carbon nanotube layer dissolves into the contact metal forming an end-bonded contact, wherein the end-bonded contact is in direct physical contact with the dielectric layer and contacts the carbon nanotube layer at a single contact interface surface between the end-bonded contact and the carbon nanotube layer, and wherein annealing consists of thermally annealing.

2. The method of claim 1, wherein thermally annealing the device comprises heating the device at a temperature of less than about 1000° C.

3. The method of claim 1, wherein thermally annealing the device comprises heating the device at a temperature of between about 400° C. and about 600° C.

4. The method of claim 1, wherein thermally annealing the device comprises heating the device at a temperature of about 600° C.

5. The method of claim 1, wherein thermally annealing the device comprises heating the device at a temperature of about 400° C.

6. The method of claim 1, wherein the contact metal is any of nickel, cobalt, iron, copper, gold, silver, ruthenium, palladium, platinum, iridium, and any mixtures or alloys thereof.

7. The method of claim 1, wherein the contact metal is nickel.

8. The method of claim 1, wherein the contact metal is cobalt.

9. The method of claim 1, wherein the resist mask is polymethyl methacrylate.

10. The method of claim 1, wherein patterning the resist mask comprises using electron beam lithography.

11. A method of forming an end-bonded contact on a semiconductor device, comprising:
    forming a dielectric layer on a substrate;
    depositing a carbon nanotube layer onto the dielectric layer;
    depositing a resist mask onto the carbon nanotube layer and patterning the resist mask to form a contact mold such that a portion of the carbon nanotube layer is exposed;
    depositing a contact metal onto the carbon nanotube layer such that the contact metal contacts the exposed carbon nanotube layer, the contact metal being a metal that does not form stable carbides at a temperature of less than about 1000° C.; and
    annealing the device such that a portion of the carbon nanotube layer dissolves into the contact metal forming an end-bonded contact, wherein the end-bonded contact is in direct physical contact with the dielectric layer and contacts the carbon nanotube layer at a single contact interface surface between the end-bonded contact and the carbon nanotube layer, and wherein annealing consists of thermally annealing.

12. The method of claim 11, wherein thermally annealing the device comprises heating the device at a temperature of between about 400° C. and about 600° C.

13. The method of claim 11, wherein thermally annealing the device comprises heating the device at a temperature of about 600° C.

14. The method of claim 11, wherein thermally annealing the device comprises heating the device at a temperature of about 400° C.

15. The method of claim 11, wherein thermally annealing the device comprises heating the device at a temperature sufficient to cause the carbon nanotube layer to dissolve into the contact metal without forming a carbide.

16. The method of claim 11, wherein the contact metal is any of nickel, cobalt, iron, copper, gold, silver, ruthenium, palladium, platinum, iridium, and any mixtures or alloys thereof.

17. The method of claim 11, wherein the contact metal is nickel.

* * * * *